(12) United States Patent
Chen et al.

(10) Patent No.: US 12,543,284 B2
(45) Date of Patent: Feb. 3, 2026

(54) BRACKET ASSEMBLY WITH ROTATABLE RETAINER

(71) Applicant: Quanta Computer Inc., Taoyuan (TW)

(72) Inventors: Chao-Jung Chen, Taoyuan (TW);
Yao-Long Lin, Taoyuan (TW);
Cheng-Pang Kuan, Taoyuan (TW);
Tuan-Wei Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 358 days.

(21) Appl. No.: 18/453,576

(22) Filed: Aug. 22, 2023

(65) Prior Publication Data
US 2024/0414867 A1      Dec. 12, 2024

Related U.S. Application Data

(60) Provisional application No. 63/506,497, filed on Jun. 6, 2023.

(51) Int. Cl.
*H05K 7/14*      (2006.01)
(52) U.S. Cl.
CPC .................. *H05K 7/1402* (2013.01)
(58) Field of Classification Search
CPC ..................................... H05K 7/1402
USPC ........................................... 361/801
See application file for complete search history.

(56) References Cited

U.S. PATENT DOCUMENTS

| | | | | |
|---|---|---|---|---|
| 10,750,630 | B2* | 8/2020 | Tsorng | H05K 7/1487 |
| 10,973,147 | B1* | 4/2021 | Tsorng | H05K 7/20754 |
| 2002/0182896 | A1* | 12/2002 | Welsh | H05K 7/1409 439/1 |
| 2003/0107878 | A1* | 6/2003 | Kaminski | H05K 7/1405 361/759 |
| 2007/0242442 | A1* | 10/2007 | Dai | H05K 7/1408 361/801 |
| 2020/0068731 | A1* | 2/2020 | Tsorng | H05K 5/0221 |

* cited by examiner

*Primary Examiner* — Zhengfu J Feng
(74) *Attorney, Agent, or Firm* — NIXON PEABODY LLP

(57) ABSTRACT

A bracket assembly for securing a removable device within a computing system, and a bay with a bracket assembly are disclosed. The bracket assembly includes a bracket and a retainer. The bracket attaches to an exterior surface of a tray of the computing system, where the tray is configured to hold the removable device. The bracket includes a first flexible retention mechanism and a second flexible retention mechanism. The retainer is rotatably connected to the bracket. The retainer is configured to restrict withdrawal of the removable device from the tray when the retainer is retained in a locked position by the first flexible retention mechanism. The retainer further is configured to not restrict withdrawal of the removable device from the tray when the retainer is retained in an open position by the second flexible retention mechanism. The retainer is configured to rotate from the locked position to the open position.

17 Claims, 10 Drawing Sheets

BRACKET ASSEMBLY WITH ROTATABLE RETAINER

CROSS-REFERENCE TO RELATED APPLICATIONS

This application claims priority from and the benefit of U.S. Provisional Patent Application Ser. No. 63/506,497, filed on Jun. 6, 2023, titled "Rotational Tool Less Card Locking Mechanism," which is hereby incorporated by reference herein in its entirety.

FIELD OF THE INVENTION

The present invention relates generally to a structure for securing a peripheral component interconnect (PCI) device, peripheral component interconnect express (PCIe) device, or similar device to a computing system, such as a server computing system, and more specifically, to a toolless locking mechanism for securing such devices to a computing system.

BACKGROUND OF THE INVENTION

Computing systems often includes devices, such as PCI, PCIe, or similar devices, that are connected internally to the systems. Conventionally, screws or latches are used to secure the devices to the computing systems. However, such screws or latches need tools to secure the structures.

The present disclosure is directed to solving the above-referenced problems by providing a toolless locking mechanism for toolless removal of devices from computing systems.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one embodiment of the present disclosure, a bracket assembly for securing a removable device within a computing system is disclosed. The bracket assembly includes a bracket and a retainer. The bracket attaches to an exterior surface of a tray of the computing system, where the tray is configured to hold the removable device. The bracket includes a first flexible retention mechanism and a second flexible retention mechanism. The retainer is rotatably connected to the bracket. The retainer is held in a locked position by the first flexible retention mechanism, and the locked position restricts withdrawal of the removable device from the tray. The retainer is held in an open position by the second flexible retention mechanism, and the open position allows withdrawal of the removable device from the tray. The retainer rotates between the locked position and the open position.

According to one aspect of the above embodiment, the bracket includes a pair of spaced apart flanges. According to another aspect of the above embodiment, the first flexible retention mechanism and the second flexible retention mechanism are attached to one flange of the pair of spaced apart flanges. According to another aspect of the above embodiment, the retainer includes a first aperture that engages with the first flexible retention mechanism, with the retainer in the locked position, and a second aperture that engages with the second flexible retention mechanism, with the retainer in the open position. According to another aspect of the above embodiment, the retainer includes a pair of spaced apart opposing apertures that accept opposing pins in the bracket, about which the retainer rotates. According to another aspect of the above embodiment, the first flexible retention mechanism and the second flexible retention mechanism each include a spring acting against a ball. According to another aspect of the above embodiment, the retainer in the open position restricts a flange of the removable device from translating within a slot of the tray, which restricts withdrawal of the removable device from the tray.

According to another embodiment of the present disclosure, a bay is disclosed. The bay includes a tray and a bracket assembly. The tray is configured to hold a removable device. The tray includes a front face with an interior surface facing inside the tray and an exterior surface facing outside the tray. The bracket assembly includes a bracket and a retainer. The bracket is attached to the exterior surface of the tray and includes a first fastener and a second fastener. The retainer is rotatably connected to the bracket. The retainer being held by the first fastener in a first position, where the first position restricts withdrawal of the removable device from the tray. The retainer being held by the second fastener in a second position, where the second position allows withdrawal of the removable device from the tray. The retainer rotates about the bracket between the first position and the second position.

According to one aspect of the above embodiment, the bracket includes a pair of spaced apart flanges. According to one aspect of the above embodiment, the first fastener and the second fastener are attached to one flange of the pair of spaced apart flanges. According to one aspect of the above embodiment, the retainer includes a first aperture that engages with the first fastener with the retainer in the first position and a second aperture that engages with the second fastener with the retainer in the second position. According to one aspect of the above embodiment, the retainer includes a pair of spaced apart opposing apertures about which the retainer rotates. According to one aspect of the above embodiment, the first fastener and the second fastener each are flexible retention mechanisms. According to one aspect of the above embodiment, the first flexible retention mechanism and the second flexible retention mechanism each include a spring acting against a ball. According to one aspect of the above embodiment, the tray includes a slot. The removable device includes a flange that sits within the slot. The retainer in the second position restricts the flange from translating within the slot to restrict withdrawal of the removable device from the tray. According to one aspect of the above embodiment, the bay further includes an arm configured to rotate between a first position, which restricts the retainer from rotating out of the first position, and a second position, which does not restrict the retainer from rotating out of the first position. According to one aspect of the above embodiment, the bay includes a third fastener configured to restrict the arm from rotating out of the first position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
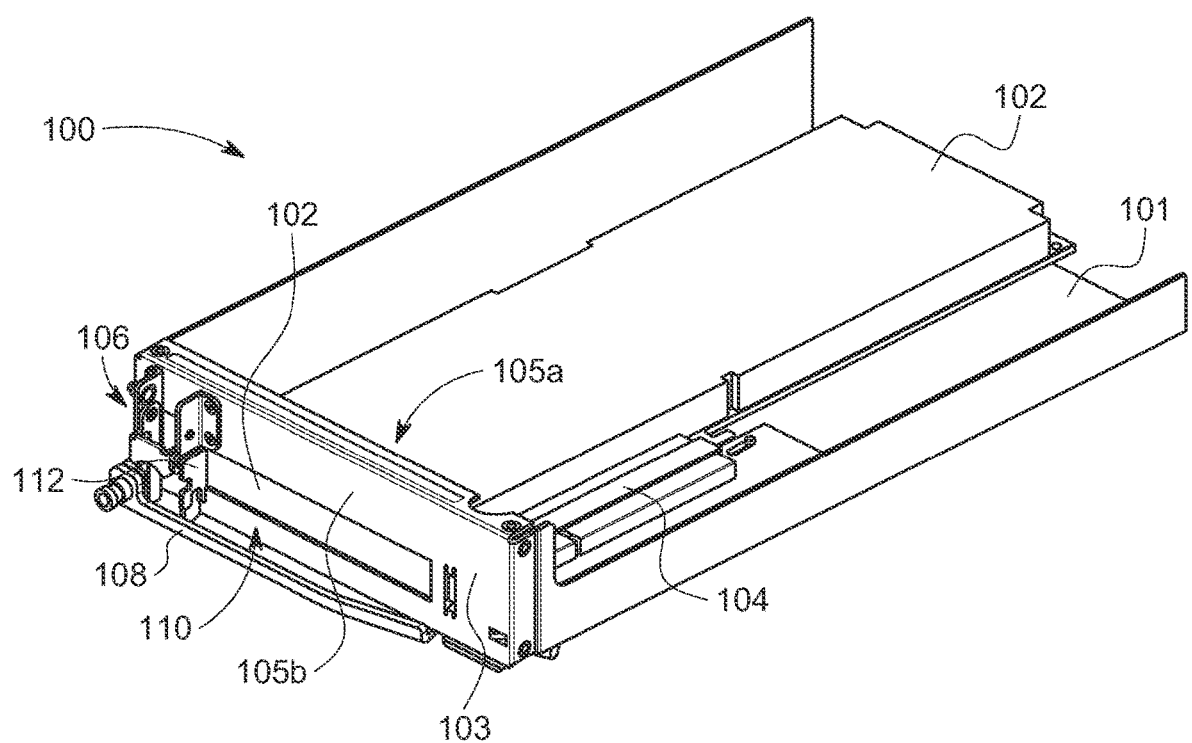
FIG. 1 shows a perspective view of a bay, according to an aspect of the present disclosure.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

The present disclosure is directed to a rotational toolless bracket assembly that generally provides for a locking mechanism that secure devices, such as PCIe devices, within a computing system. The locking mechanisms of the present disclosure include one or more fasteners that can keep the locking mechanisms in the open and locked positions without complicated operation, such as without the need for separate tools. The locking mechanisms of the present disclosure provide a better way to secure devices within a computing system as compared to conventional latch mechanisms.

FIG. 1 shows a perspective view of a bay 100, according to an aspect of the present disclosure. The bay 100 is configured to hold a removable device 102. According to some implementations, the bay 100 can be a component of a chassis of a computing system and the removable device 102 can be a removable device of the computing system. For example, the removable device 102 can be a PCI or PCIe device and the bay 100 can be the area of the chassis that holds the PCI device.

The bay 100 includes a tray 101 that is configured to hold the removable device 102. The tray 101 can include an interface 104 that is configured to connect to a corresponding interface (concealed by interface 104) on the removable device 102. For example, the interface 104 can be a PCI express interface.

The tray 101 further includes a front face 103, which includes an interior surface 105a facing inside the tray 101 and an exterior surface 105b facing outside the tray 101. The front face 103 further includes a slot 110 through which part of the removable device 102 extends. Specifically, the removable device 102 can include a flange 112 that extends through the slot 110 when the removable device 102 is seated within the tray 101 (e.g., connected to the interface 104).

The exterior surface 105*b* of the front face 103 of the tray 101 includes a bracket assembly 106. The bracket assembly 106 is configured to restrict the removable device 102 from being removed from the bay 100, as further described below.

According to some implementations, the bay 100 can include an arm 108. The arm 108 can be configured to rotate between a first position, which restricts action of the bracket assembly 106, and a second position, which does not restrict action of the bracket assembly 106, as further described below.

Figure 2:
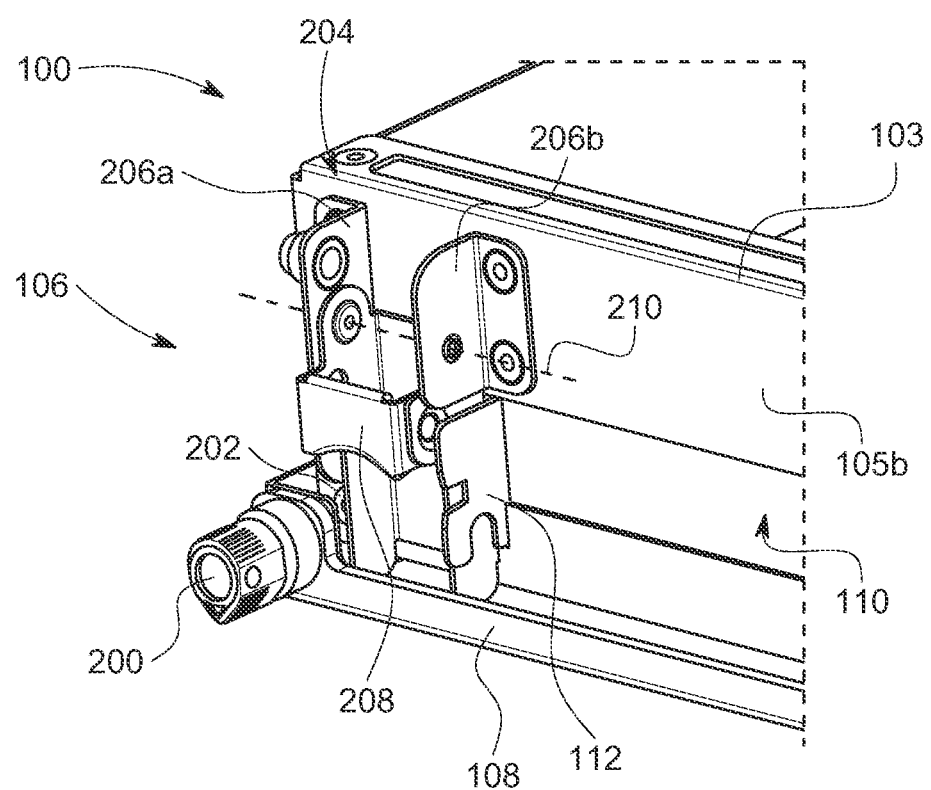
FIG. 2 shows a detailed perspective view of a bracket assembly, according to an aspect of the present disclosure.

FIG. 2 shows a detailed perspective view of the bracket assembly 106. The bracket assembly 106 includes a bracket 204 and a retainer 208. The bracket 204 is attached to the exterior surface 105*b* of the tray 101. The bracket 204 is formed of a pair of spaced apart flanges 206*a* and 206*b* that extend out from the exterior surface 105*b* of the tray 101. However, according to some implementations, the bracket 204 can be formed of a single flange (e.g., 206*a*).

The retainer 208 is rotatably connected to the bracket 204. For example, the retainer 208 is rotatably connected to the bracket 204 about an axis of rotation, generally designated by the dashed line 210 in FIG. 2. The arm 108 is shown in the first position, described above, where the arm 108 restricts movement of the retainer 208. According to some implementations, the arm 108 can include a fastener 200, which can lock the arm 108 in the position shown in FIG. 2. The fastener 200 can be, for example, a quarter-turn fastener that engages an aperture 202 (FIG. 5) of the front face 103.

Figure 3A:
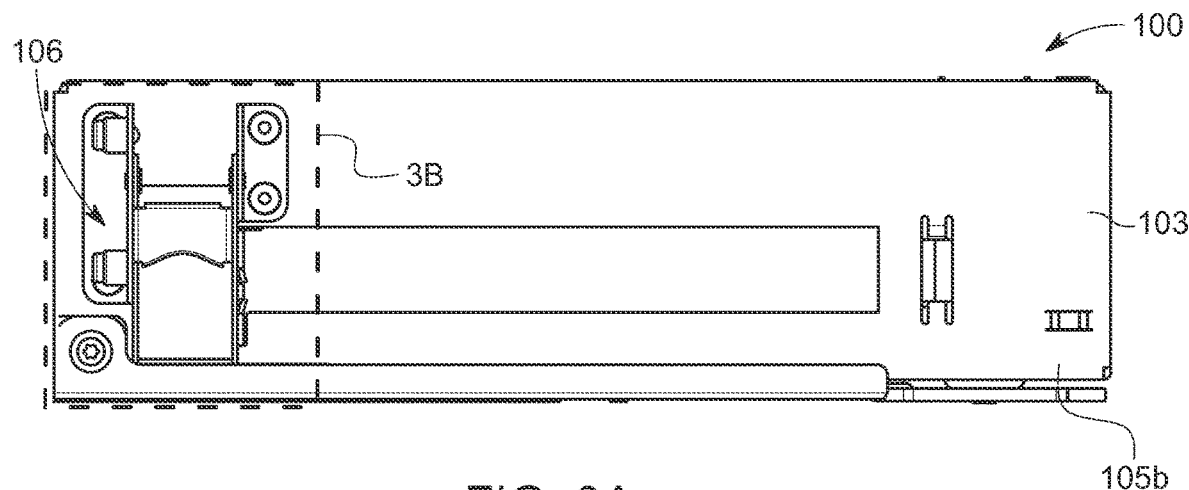
FIG. 3A shows a front view of a bay, according to an aspect of the present disclosure.

Referring to FIG. 3A, shown is a front view of the bay 100, according to an aspect of the present disclosure. As discussed above, the bay 100 includes the exterior surface 105*b* of the front face 103 of the tray 101 (FIG. 1). The bay 100 further includes the bracket assembly 106. FIG. 3A includes a rectangular dashed line representing what is shown in FIG. 3B.

Figure 3B:
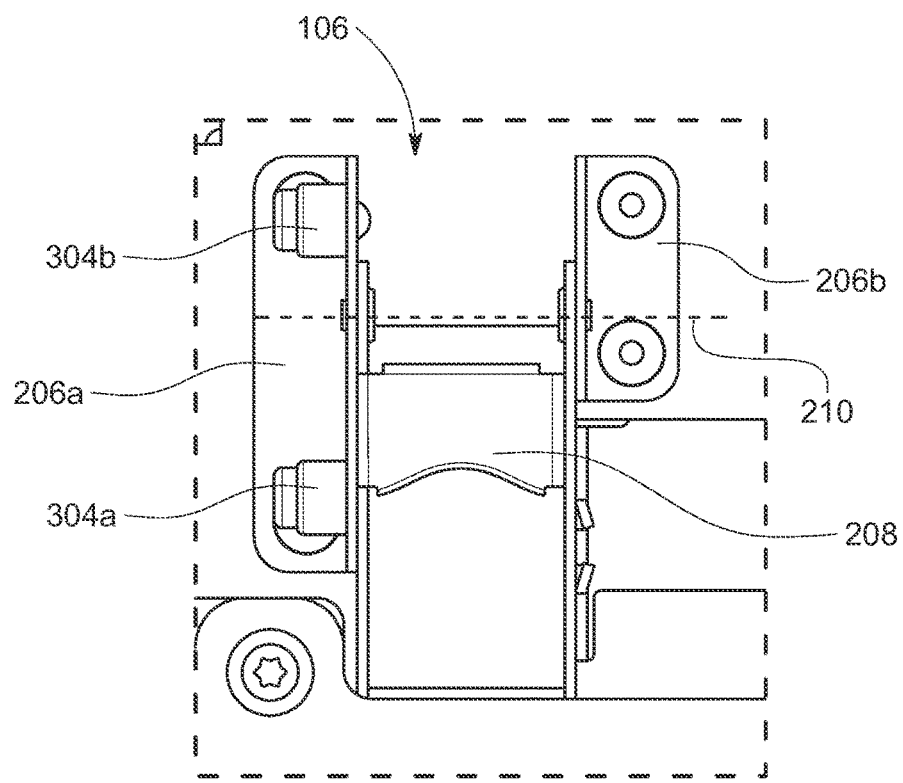
FIG. 3B shows a detailed front view of a bracket assembly in FIG. 3A, according to an aspect of the present disclosure.

Specifically, referring to FIG. 3B, the bracket assembly 106 includes the bracket 204, which includes a first fastener 304*a* and a second fastener 304*b*. The fasteners 304*a* and 304*b* can be various types of fasteners. According to some implementations, the fasteners 304*a* and 304*b* can be flexible retention mechanisms. Flexible retention mechanisms flexibly deflect to retain an object. According to some specific implementations, the flexible retention mechanisms can be ball-nose spring plungers. According to such an arrangement, the balls of the ball-nose spring plungers retain an object but can be flexibly depressed to release the object.

Figure 4:
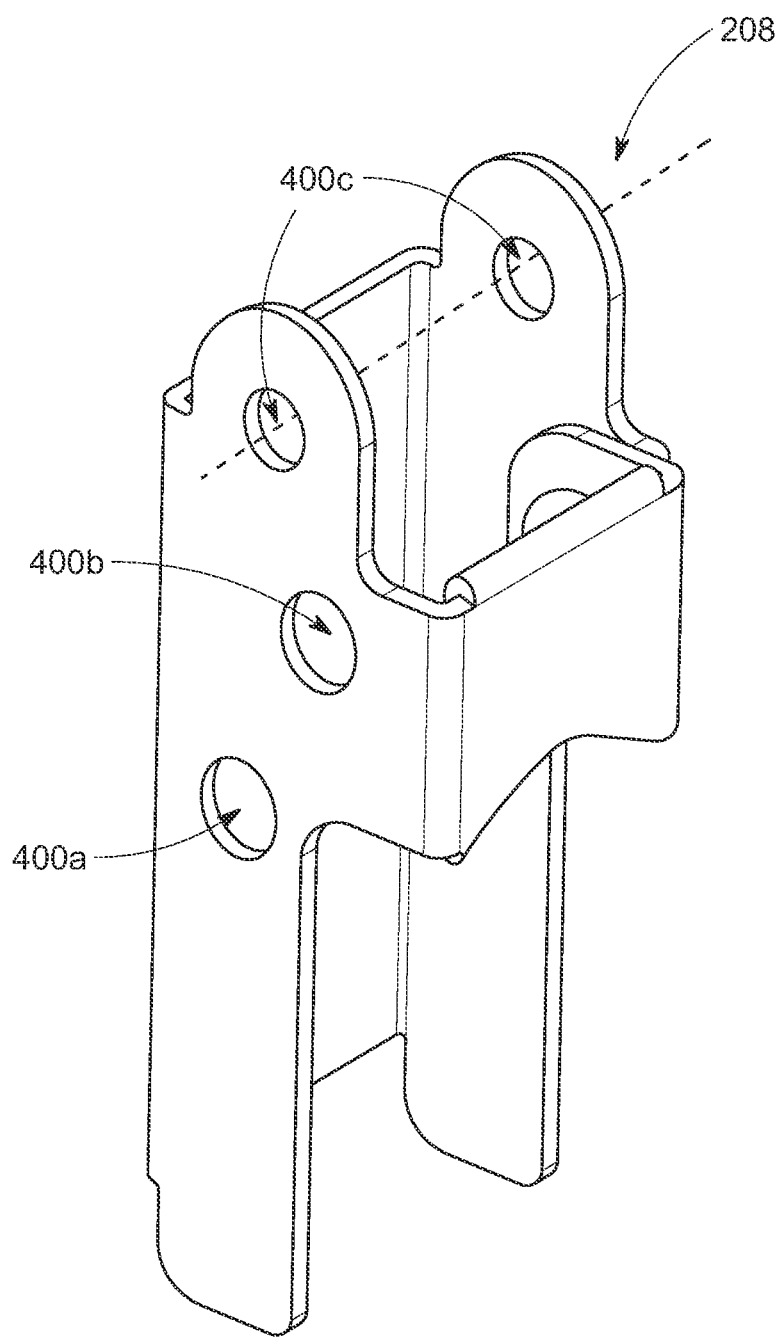
FIG. 4 shows a perspective view of a retainer, according to an aspect of the present disclosure.

Referring to FIG. 4, the retainer 208 includes an aperture 400*a* and an aperture 400*b*. The retainer 208 is arranged within the bracket assembly 106 such that the fastener 304*a* (FIG. 3B) engages the aperture 400*a* when the retainer 208 is in the first position. As further described below in FIG. 6, in the first position, the retainer 208 is configured to restrict withdrawal of the removable device 102 (FIG. 1) from the tray 101 (FIG. 1). Further, the retainer 208 is arranged within the bracket assembly 106 such that the fastener 304*b* (FIG. 3B) engages the aperture 400*b* when the retainer 208 is in the second position. As further described below in FIG. 7, in the second position, the retainer 208 is configured to not restrict withdrawal of the removable device 102 (FIG. 1) from the tray (FIG. 1).

The retainer 208 also includes apertures 400*c*, which connect the retainer 208 to the bracket 204 so that the retainer 208 can rotate relative to the bracket 204.

Figure 5:
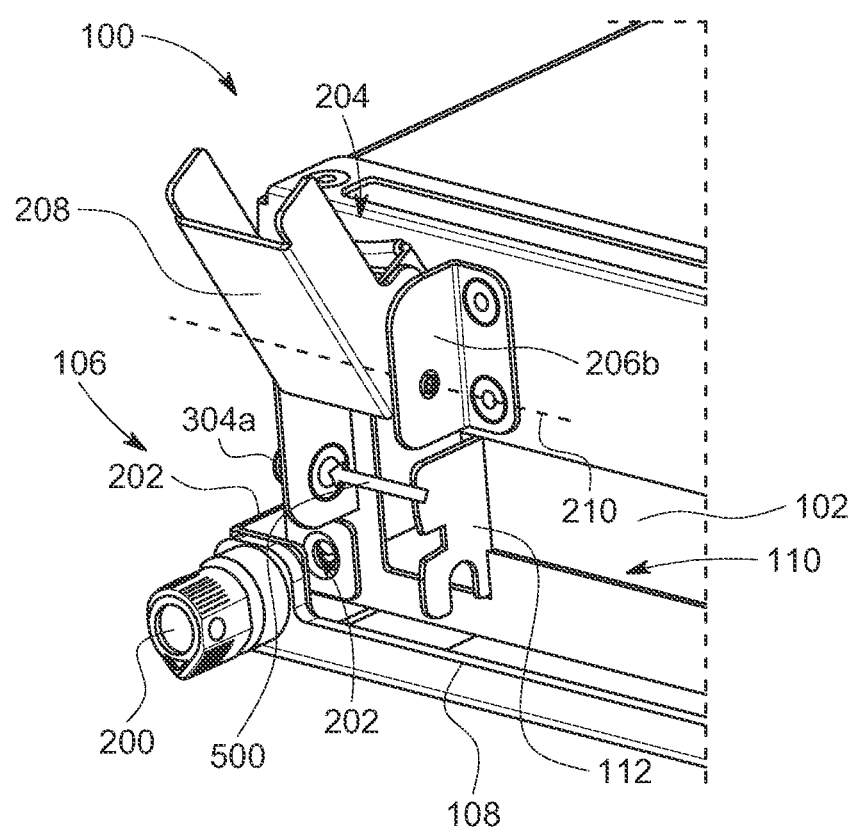
FIG. 5 shows a detailed perspective view of a bracket assembly, according to an aspect of the present disclosure.

Referring to FIG. 5, shown is another detailed perspective view of the bracket assembly 106, according to an aspect of the present disclosure. More specifically, the retainer 208 of the bracket assembly 106 is shown in a second position. The retainer 208 in the second position as shown allows for the removable device 102 to be removed. Specifically, the retainer 208 in the second position does not block the flange 112 from moving in the direction of arrow 500 within the slot 110. As described further below with respect to FIG. 10, movement of the flange 112 in the direction of arrow 500 lets the removable device 102 be removed from the bay 100.

Figure 6:
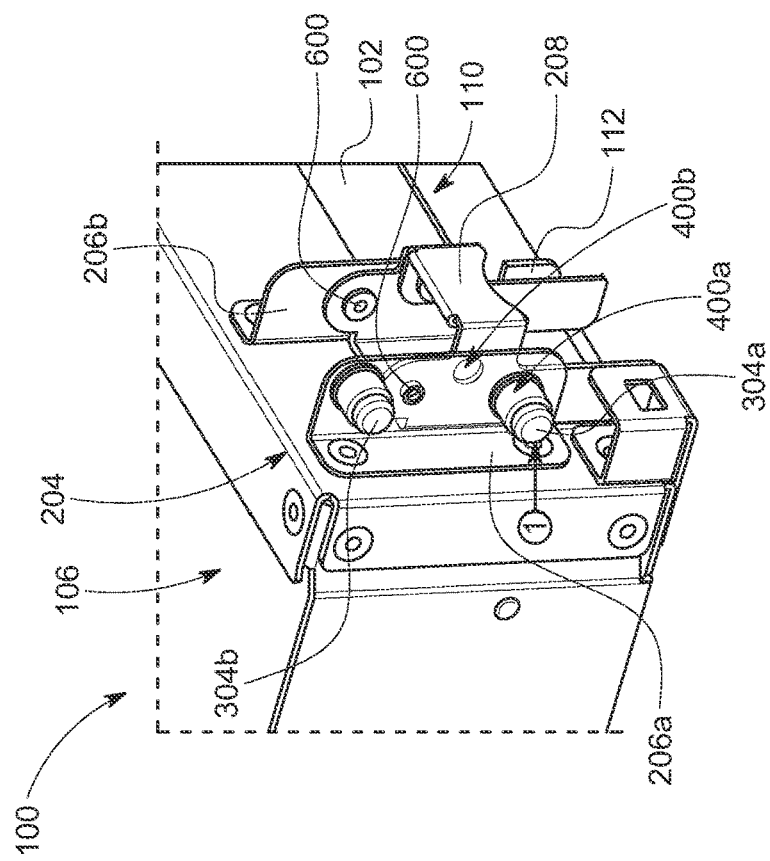
FIG. 6 shows a detailed perspective view of the operation of a retainer of a bracket assembly, according to an aspect of the present disclosure.

FIG. 6 shows a detailed perspective view of the retainer 208 of the bracket assembly 106 in a locked position, also referred to as a first position above, according to an aspect of the present disclosure. Specifically, the retainer 208 is in a vertical position. In the vertical or locked position, the retainer 208 prevents the flange 112 of the removable device 102 from moving within the slot 110, as further discussed below.

The retainer 208 is secured within the vertical or locked position by the fastener 304*a* of the bracket 204. Specifically, the fastener 304*a* extends into the aperture 400*a* of the retainer 208. This keeps the retainer 208 within the vertical or locked position unless sufficient rotational force is applied to the retainer 208 to overcome the force of the fastener 304*a*. When the retainer 208 is in the vertical or locked position, the fastener 304*b* of the bracket 204 does not engage with any feature of the retainer 208.

According to some implementations, the bracket 204 can also include a pair of opposing pins 600. The opposing pins 600 engage the apertures 400*c* of the retainer 208. The pins 600 engaging the apertures 400*c* allows the retainer 208 to rotate about the pins 600.

Figure 7:
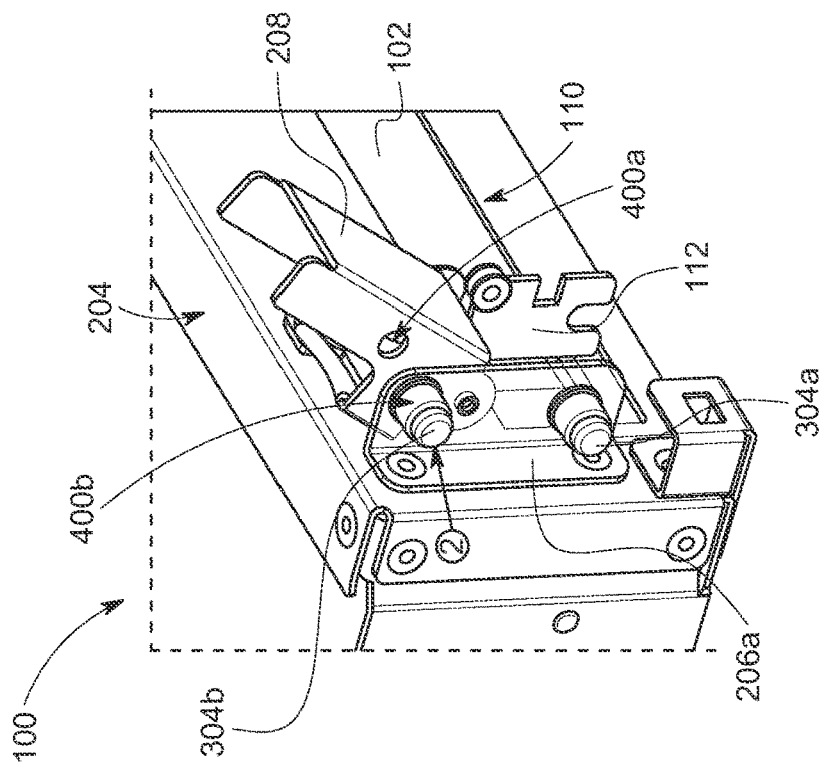
FIG. 7 shows another detailed perspective view of the operation of a retainer of a bracket assembly, according to an aspect of the present disclosure.

FIG. 7 shows a detailed perspective view of the retainer 208 of the bracket assembly 106 in an open position, also referred to as a second position above, according to an aspect of the present disclosure. Specifically, the retainer 208 has rotated out of being in the vertical or locked position. For example, sufficient rotational force may have been applied to the retainer 208 to overcome the force of the fastener 304*a*.

The retainer 208 is secured within the open position by the fastener 304*b* of the bracket 204. Specifically, the fastener 304*b* extends into the aperture 400*b* of the retainer 208. This keeps the retainer 208 within the open position unless sufficient rotational force is applied to the retainer 208 to overcome the force of the fastener 304*b*. When the retainer 208 is in the open position, the fastener 304*a* of the bracket 204 does not engage with any feature of the retainer 208.

With the retainer 208 secured by the bracket 204 in the open position, the retainer 208 no longer blocks the flange 112 of the removable device 102. Thus, the flange 112, and the removable device 102 as a whole, can slide within the slot 110 for removing the removable device 102, as discussed further below.

Figure 8:
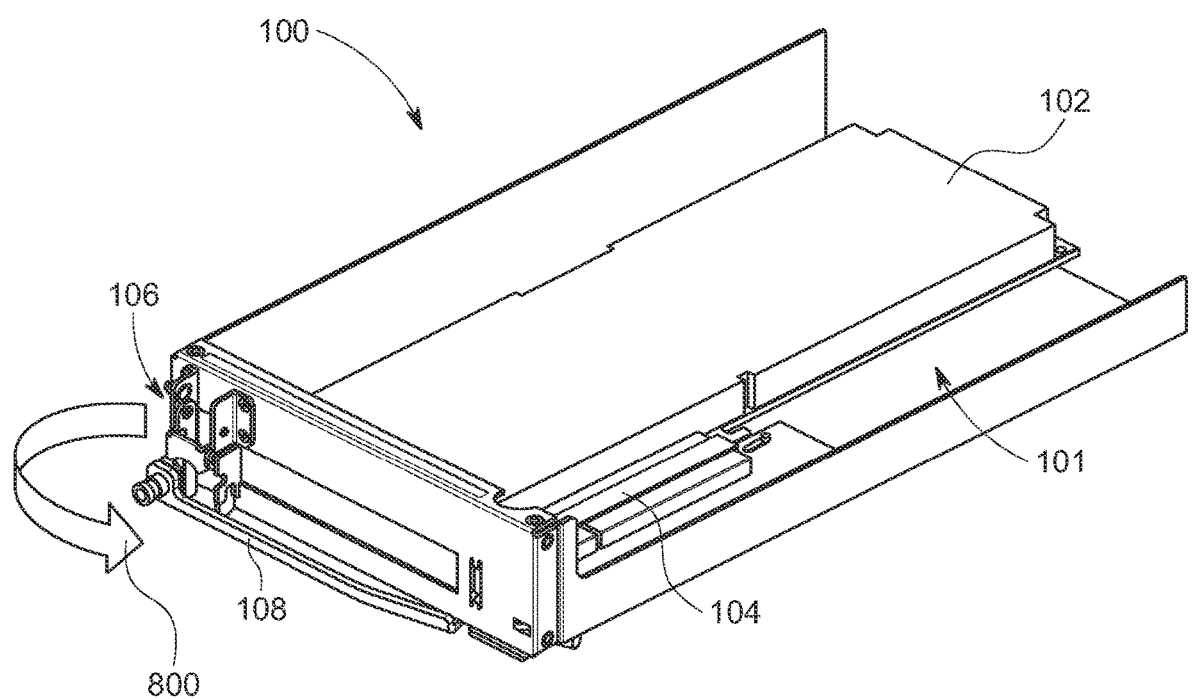
FIG. 8 shows a perspective view of an operation of the bracket assembly of a bay, according to an aspect of the present disclosure.

FIG. 8 shows a perspective view of an operation of the bracket assembly 106 of a bay 100, according to an aspect of the present disclosure. More specifically, FIG. 8 shows the first operation for removing the removable device 102 from the slot 110 of the bay 100. The first operation shown in FIG. 8 is the arm 108 being rotated from the closed or locked position. Specifically, the arm 108 is rotated in the direction of arrow 800 from the closed or locked position and into the open or unlocked position. Where the bay 100 includes the fastener 200 shown in FIG. 2, prior to rotating the arm 108, the fastener 200 may be unlocked from the corresponding aperture 202 (FIG. 5).

Figure 9:
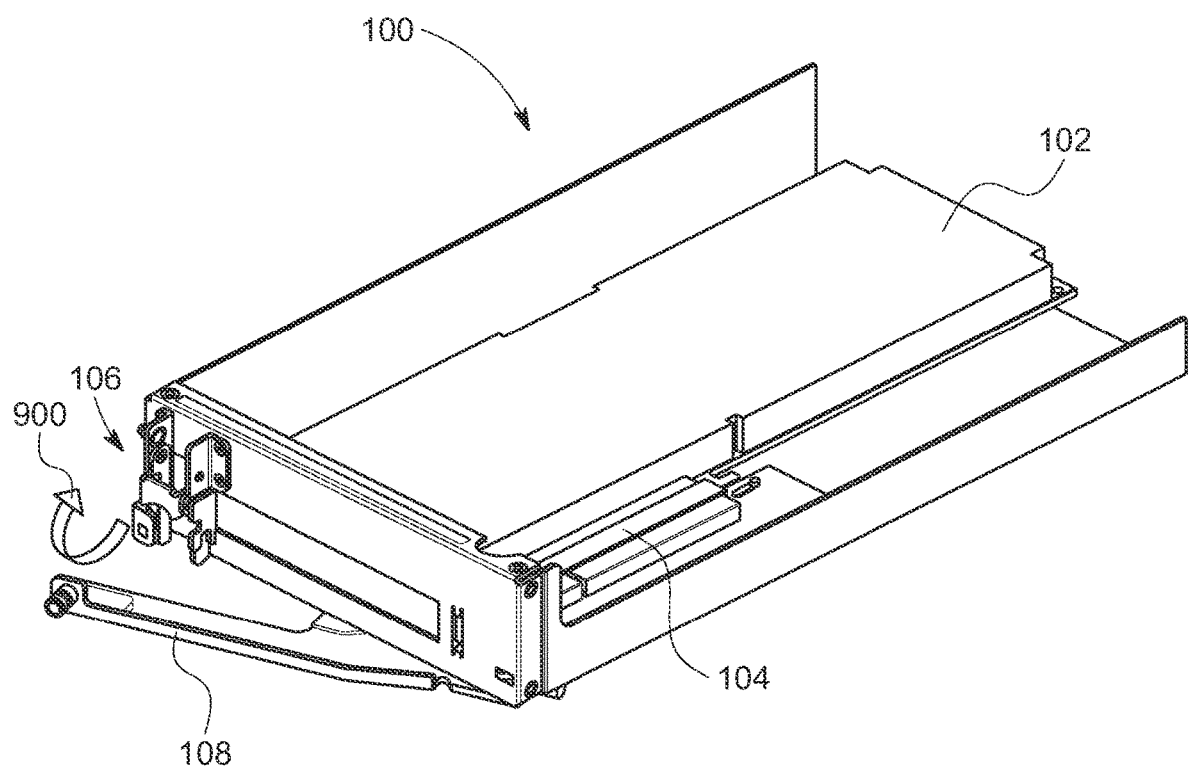
FIG. 9 shows another perspective view of an operation of the bracket assembly on a bay, according to an aspect of the present disclosure.

Next, FIG. 9 shows a perspective view of an operation of the bracket assembly 106 of a bay 100, according to an aspect of the present disclosure. More specifically, FIG. 9 shows the arm 108 in the open or unlocked position after FIG. 8. Further, FIG. 9 shows the second operation for removing the removable device 102 from the slot 110 of the bay 100. The second operation shown in FIG. 9 is the retainer 208 being rotated from the vertical or locked position. Specifically, the retainer 208 is rotated in the direction of arrow 900 from the vertical or locked position and into the open position.

Figure 10:
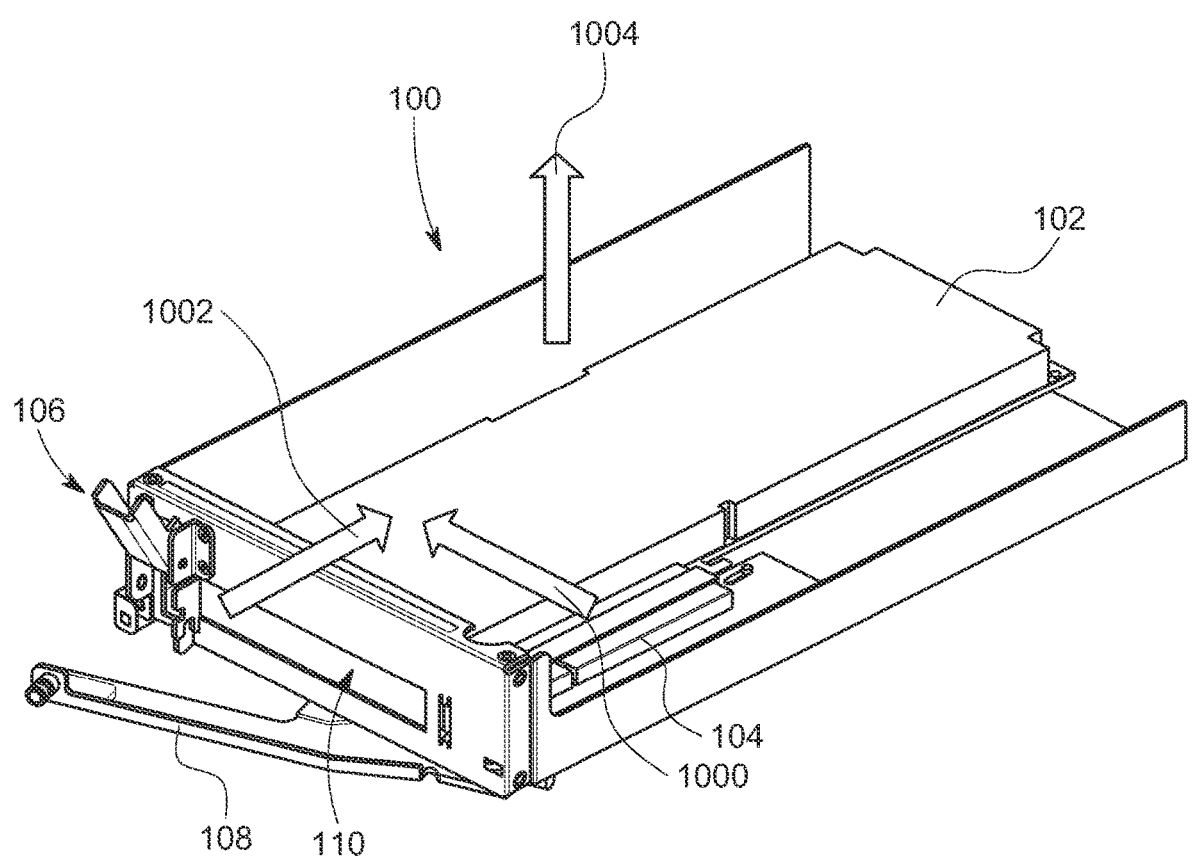
FIG. 10 shows another perspective view of operations of the bracket assembly on a bay, according to an aspect of the present disclosure.

FIG. 10 shows a perspective view of subsequent operations for removing a removable device 102 from a bay 100, according to an aspect of the present disclosure. More specifically, FIG. 10 shows the retainer 208 in the open position after FIG. 9. Further, FIG. 10 shows subsequent operations for removing the removable device 102 from the slot 110 of the bay 100. Specifically, with the retainer 208 in the open position, the flange 112, and the removable device 102 as a whole, can slide within the slot 110 in the direction of arrow 1000. This allows the removable device 102 to release from the interface 104 of the bay 100. Thereafter, the removable device 102 can be withdrawn from the slot 110 by sliding in the direction of arrow 1002. The removable device 102 can then be withdrawn from the bay 100 by being lifted in the direction of arrow 1004.

Figure 11:
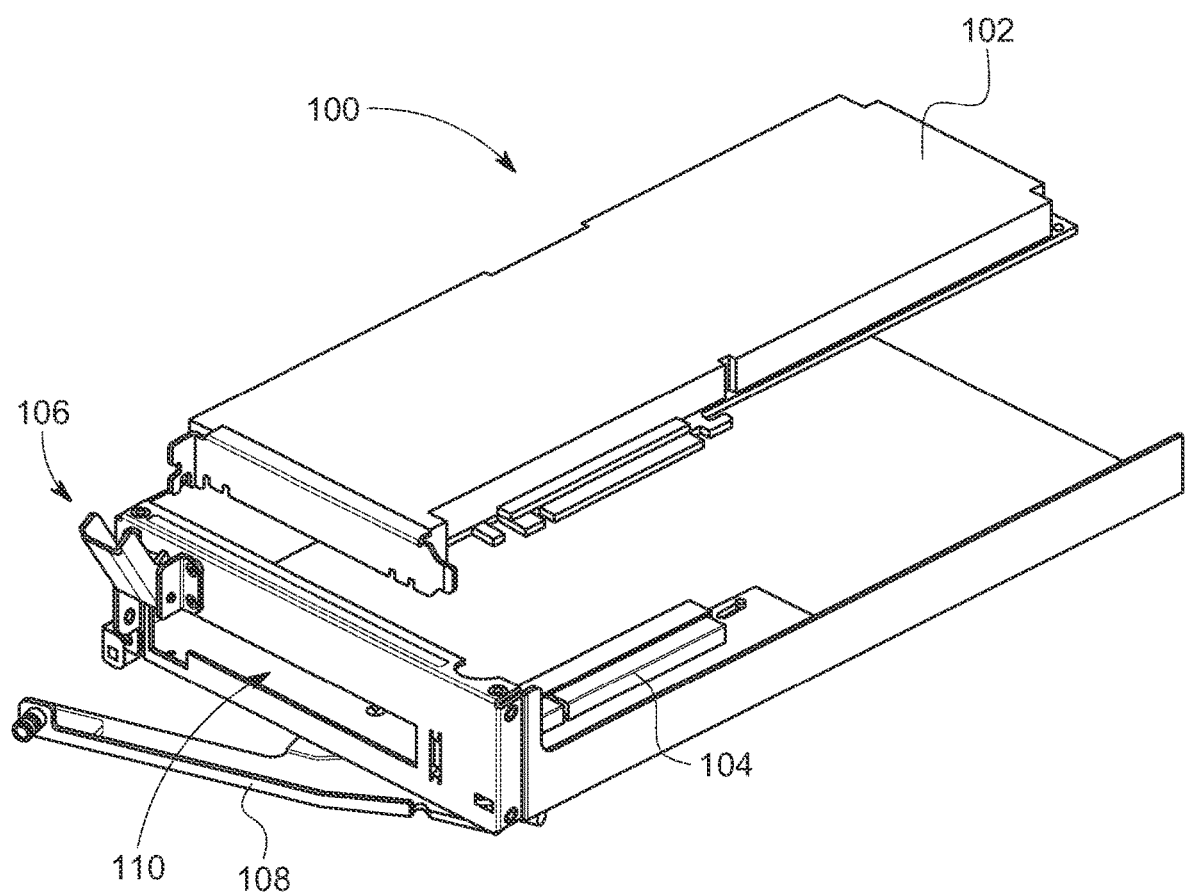
FIG. 11 shows a perspective view of the removable device removed from the bay, according to an aspect of the present disclosure.

FIG. 11 shows a perspective view of the removable device 102 removed from the bay 100, according to an aspect of the present disclosure. More specifically, FIG. 11 shows the removable device 102 withdrawn from the slot 110 and the bay 100 after FIG. 9.

The operations of FIGS. 8-11 can all be conducted without needing a tool and, more specifically, without needing a tool for moving the retainer 208 from the vertical or locked position of FIG. 8 to the open position of FIGS. 10 and 11. Yet, the bracket assembly 106 can still resist the removable device 102 from being removed from the bay 100. Further, insertion of the removable device 102 into the bay 100 can be the same process as in FIGS. 8-11 but in reverse.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A bracket assembly for securing a removable device within a computing system, the bracket assembly comprising:
   a bracket that attaches to an exterior surface of a tray of the computing system, the tray being configured to hold the removable device, the bracket including a first flexible retention mechanism and a second flexible retention mechanism; and
   a retainer rotatably connected to the bracket, the retainer being held in a locked position by the first flexible retention mechanism, the locked position restricting withdrawal of the removable device from the tray, the retainer being held in an open position by the second flexible retention mechanism, the open position allowing withdrawal of the removable device from the tray, the retainer rotating between the locked position and the open position.

2. The bracket assembly of claim 1, wherein the bracket includes a pair of spaced apart flanges.

3. The bracket assembly of claim 2, wherein the first flexible retention mechanism and the second flexible retention mechanism are attached to one flange of the pair of spaced apart flanges.

4. The bracket assembly of claim 1, wherein the retainer includes a first aperture that engages with the first flexible retention mechanism, with the retainer in the locked position, and a second aperture that engages with the second flexible retention mechanism, with the retainer in the open position.

5. The bracket assembly of claim 1, wherein the retainer includes a pair of spaced apart opposing apertures that accept opposing pins in the bracket, about which the retainer rotates.

6. The bracket assembly of claim 1, wherein the first flexible retention mechanism and the second flexible retention mechanism each include a spring acting against a ball.

7. The bracket assembly of claim 1, wherein the retainer in the open position restricts a flange of the removable device from translating within a slot of the tray, which restricts withdrawal of the removable device from the tray.

8. A bay comprising:
   a tray configured to hold a removable device, the tray including a front face with an interior surface facing inside the tray and an exterior surface facing outside the tray; and
   a bracket assembly including a bracket and a retainer, the bracket being attached to the exterior surface of the tray and including a first fastener and a second fastener, and the retainer being rotatably connected to the bracket, the retainer being held by the first fastener in a first position, the first position restricting withdrawal of the removable device from the tray, the retainer being held by the second fastener in a second position, the second position allowing withdrawal of the removable device from the tray, and the retainer rotating about the bracket between the first position and the second position.

9. The bay of claim 8, wherein the bracket includes a pair of spaced apart flanges.

10. The bay of claim 9, wherein the first fastener and the second fastener are attached to one flange of the pair of spaced apart flanges.

11. The bay of claim 8, wherein the retainer includes a first aperture that engages with the first fastener with the retainer in the first position and a second aperture that engages with the second fastener with the retainer in the second position.

12. The bay of claim 8, wherein the retainer includes a pair of spaced apart opposing apertures about which the retainer rotates.

13. The bay of claim 8, wherein the first fastener and the second fastener each are flexible retention mechanisms.

14. The bay of claim 13, wherein the first flexible retention mechanism and the second flexible retention mechanism each include a spring acting against a ball.

15. The bay of claim 8, wherein the tray includes a slot, and the removable device includes a flange that sits within the slot, and wherein the retainer in the second position restricts the flange from translating within the slot to restrict withdrawal of the removable device from the tray.

16. The bay of claim 8, further comprising:
an arm configured to rotate between a first position, which restricts the retainer from rotating out of the first position, and a second position, which does not restrict the retainer from rotating out of the first position.

17. The bay of claim 16, further comprising:
a third fastener configured to restrict the arm from rotating out of the first position.

* * * * *